(12) United States Patent
Bauer et al.

(10) Patent No.: US 10,566,463 B2
(45) Date of Patent: Feb. 18, 2020

(54) POWER SEMICONDUCTOR DEVICE WITH FLOATING FIELD RING TERMINATION

(71) Applicant: ABB Schweiz AG, Baden (CH)

(72) Inventors: Friedhelm Bauer, Semione (CH); Umamaheswara Vemulapati, Windisch (CH); Marco Bellini, Schlieren (CH)

(73) Assignee: ABB Schweiz, Baden (CH)

( * ) Notice: Subject to any disclaimer, the term of this patent is extended or adjusted under 35 U.S.C. 154(b) by 0 days.

(21) Appl. No.: 16/420,803

(22) Filed: May 23, 2019

(65) Prior Publication Data
US 2019/0288124 A1  Sep. 19, 2019

Related U.S. Application Data

(63) Continuation of application No. PCT/EP2017/079812, filed on Nov. 20, 2017.

(30) Foreign Application Priority Data

Nov. 24, 2016 (EP) .................... 16200438

(51) Int. Cl.
  *H01L 29/06* (2006.01)
  *H01L 29/861* (2006.01)
  *H01L 29/868* (2006.01)

(52) U.S. Cl.
  CPC ...... *H01L 29/8611* (2013.01); *H01L 29/0619* (2013.01); *H01L 29/868* (2013.01)

(58) Field of Classification Search
  CPC ... H01L 29/06; H01L 29/061; H01L 29/0619; H01L 29/86; H01L 29/868; H01L 29/861; H01L 29/8611

(Continued)

(56) References Cited

U.S. PATENT DOCUMENTS

| | | | |
|---|---|---|---|
| 9,147,763 B2 * | 9/2015 | Weber | H01L 29/7804 |
| 9,859,360 B2 * | 1/2018 | Antoniou | H01L 29/404 |
| 2015/0102362 A1 | 4/2015 | Hung et al. | |

OTHER PUBLICATIONS

European Patent Office, International Search Report & Written Opinion issued in corresponding Application No. PCT/EP2017/079812, dated Feb. 21, 2018, 11 pp.

(Continued)

*Primary Examiner* — Monica D Harrison
(74) *Attorney, Agent, or Firm* — Taft Stettinius & Hollister LLP; J. Bruce Schelkopf

(57) ABSTRACT

In a power semiconductor device of the application a total number n of floating field rings ($10\_1$ to $10\_n$) formed in a termination area is at least 10. For any integer i in a range from i=2 to i=n, a ring-to-ring separation $d_{i,i-i}$ between an i-th floating field ring and a directly adjacent (i−1)-th floating field ring, when counting the floating field rings ($10\_1$ to $10\_n$) along a straight line starting from a main pn-junction and extending in a lateral direction away from the main pn-junction, is given by the following formula: $d_{i,i-1}=d_{1,0}+\sum_{j=1}^{j=i-1}\Delta_j$ for i=2 to n, wherein $d_{1,0}$ is a distance between the innermost floating field ring ($10\_1$) closest to the main pn-junction and the main pn-junction, and wherein: $\Delta_{zone1}-0.05\cdot\Delta_{zone2}<\Delta_j<\Delta_{zone1}+0.05\cdot\Delta_{zone2}$ for j=1 to I−2, $2\cdot\Delta_{zone2}<|\Delta_j|<10\cdot\Delta_{zone2}$ for j=I−1, $0.95\cdot\Delta_{zone2}<\Delta_j<1.05\cdot\Delta_{zone2}$ for j=I to n−1, $\Delta_{zone2}>0.1$ μm, and $-\Delta_{zone2}/2<\Delta_{zone1}<\Delta_{zone2}/2$, wherein I is an integer, for which 3≤I≤n/2.

20 Claims, 4 Drawing Sheets

(58) Field of Classification Search
USPC .......................................................... 257/487
See application file for complete search history.

(56) References Cited

OTHER PUBLICATIONS

Beck et al., "Radiation-tolerant breakdown protection of silicon detectors using multiple floating guard rings," Nuclear Instruments and Methods in Physics Research, vol. A, No. 396, 1997, pp, 214, 227.

Huo et al., "Design and Optimization of Field Limiting Rings Termination for 1200V 4H-SiC VDMosfets," 2014 12th IEEE international Conference on Solid-State and Integrated Circuit Technology, Oct. 28, 2014, 3 pp.

Sheridan et al., "Design and fabrication of planar guard ring termination for high-voltage SiC diodes," Solid-State Electronics, vol. 44, 2000, pp. 1367-1372.

Xiang-Dong et al., "Experimental arid numerical analyses of high voltage 4H-SiC junction barrier Schottky rectifiers with linearly graded field limiting ring," Chin. Phys. B, vol. 23, No. 5, 2014, 5 pp.

\* cited by examiner

POWER SEMICONDUCTOR DEVICE WITH FLOATING FIELD RING TERMINATION

FIELD OF THE INVENTION

The present invention relates to a power semiconductor device comprising a planar edge termination structure and in particular to a power semiconductor device comprising a floating field ring (FFR) termination (also called guard ring termination) in a termination region laterally surrounding an active region of a wafer.

BACKGROUND OF THE INVENTION

Semiconductor devices, in particular power semiconductor devices, require an efficient edge termination to avoid electric field crowding at the edge of a main pn-junction resulting in breakdown of the device at a relatively low breakdown voltage VBR. Common power semiconductor devices, such as a pin diode or an insulated-gate bipolar transistor (IGBT), require an edge termination in order to achieve a breakdown voltage in the range of 80 to 90% of an ideal one-dimensional diode breakdown voltage.

For silicon-based devices, known planar edge termination techniques include junction termination extension (JTE), variation of lateral doping (VLD) and floating field ring (FFR) terminations with and without field plate extensions. Etched and refilled trenches have also been used. Silicon carbide (SiC) and especially 4H-SiC is an attractive material for high power semiconductor devices due to its 10 times higher critical electrical field than that of silicon. Given the well-known restrictions with SiC process technology, there are significant technological constraints. For example, when planar junctions are formed in SiC by implantation of impurities, the junction depth is limited to about 2 µm. The advantage of a FFR termination is due to the fact that the generation of the floating field rings can be easily integrated in the manufacturing process flow. It is possible to form the power semiconductor device with a FFR termination without increasing the mask count compared to a manufacturing process for the same power semiconductor device without the FFR termination. FFR terminations are often the first choice, in particular when manufacturing costs are of highest importance.

At present FFR terminations are mainly in use for low and medium voltage components (600 V to 3.3 kV IGBT, for example). For these voltage classes, appropriate breakdown voltages are achieved with ring systems comprising 3 to 10 rings. The design of a FFR termination for high voltage components is critical with regard to the wafer area occupied by the FFR termination, with regard to the breakdown voltage and with regard to the safe operating area (SOA) of the power semiconductor device including the FFR termination. The before-mentioned wafer area occupied by the FFR termination, the breakdown voltage and the safe operating area of the power semiconductor device including the FFR termination depend on a ring-to-ring separation and on the distance of the first innermost ring from the adjacent main pn-junction besides depending on the design parameters of each ring (such as the width of each ring and the doping profile of each ring).

Complex analytical methods have been developed to design an efficient FFR termination. From "An Improved Methodology for the CAD Optimization of Multiple Floating Field-Limiting Ring Terminations", M. E. Baradai, IEEE Transactions on Electron Devices, vol. 58, No. 1, January 2011, pp. 266-270, there is known an analytical method for calculating ring-to-ring separations minimizing the area required for achieving a certain breakdown voltage. This analytical method for designing a FFR termination structure is complex in that it requires a high computational effort especially for a high total number of floating field rings. For a desired breakdown voltage an optimized FFR termination design with regard to the wafer area occupied by the FFR termination can be achieved with the method disclosed in this document. However, with regard to the safe operating area of the power semiconductor device, with this method optimum results cannot be achieved.

A less complicated design of a FFR termination is known from U.S. Pat. No. 5,075,739 A, in which a FFR termination is disclosed, wherein the ring-to-ring separation increases linearly in a lateral direction away from the main pn-junction. However, such design does also not result in optimum results with regard to the safe operating area of a power semiconductor device.

From the publication "Radiation-tolerant breakdown protection of silicon detectors using multiple floating guard rings" by Beck et al., Nucl. Instr. & Meth. in Phys. Res., Section A, vol. 396, no. 1-2, 1997, pages 214-227, there is known a multiple floating guard ring design which is optimized for high-voltage operation of silicon detectors. The distance between neighboring rings is constant in a first zone adjacent to a central diode and is increasing from inside to outside with a constant rate in a second zone.

SUMMARY OF THE INVENTION

It is the object of the invention to provide a power semiconductor device comprising a floating field ring termination structure with an increased safe operating area.

The object of the invention is attained by a power semiconductor device according to claim 1. Further developments of the invention are specified in the dependent claims.

According to the invention a power semiconductor device comprises a wafer, the wafer having an active area and a termination area laterally surrounding the active area, wherein a main pn-junction is formed in the active area, and a plurality of floating field rings formed in the termination area, each floating field ring surrounding the active area, wherein a total number n of floating field rings formed in the termination area is at least 10. For any integer i in a range from i=2 to i=n, a ring-to-ring separation $d_{i,i-1}$ between an i-th floating field ring and a directly adjacent (i−1)-th floating field ring, when counting the floating field rings along a straight line starting from the main pn-junction and extending in a lateral direction away from the main pn-junction, is given by the following formula:

$$d_{i,i-1} = d_{1,0} + \Sigma_{j=1}^{j=i-1} \Delta_j \qquad \text{for } i=2 \text{ to } n,$$

wherein $d_{1,0}$ is a distance between the innermost floating field ring closest to the main pn-junction and the main pn-junction, and wherein:

$$\Delta_{zone1} - 0.05 \cdot \Delta_{zone2} < \Delta_j < \Delta_{zone1} + 0.05 \cdot \Delta_{zone2} \qquad \text{for } j=1 \text{ to } I-2,$$

$$|\Delta_j| < 10 \cdot \Delta_{zone2}. \qquad \text{for } j=I-1$$

$$0.95 \cdot \Delta_{zone2} < \Delta_j < 1.05 \cdot \Delta_{zone2} \qquad \text{for } j=I \text{ to } n-1,$$

$$\Delta_{zone2} > 0.1 \text{ µm, and}$$

$$-\Delta_{zone2}/2 < \Delta_{zone1} < \Delta_{zone2}/2,$$

wherein I is an integer, for which $3 \leq I \leq n/2$.

Accordingly, in the invention the ring-to-ring separation $d_{i,i-1}$ is a two-zone linear function of integer i, which is the ring number of the outer one of the respective pair of neighboring floating field rings separated by the ring-to-ring separation $d_{i,i-1}$. In a first zone denoted as "zone 1" an increment $\Delta_i$ (i.e. the difference between $d_{i,i-1}$ and $d_{i-1,i-2}$ for any integer i from i=2 to i=n) is $\Delta_{zone1}$, and in a second zone denoted as "zone 2" the increment $\Delta_i$ (i.e. the difference between $d_{i,i-1}$ and $d_{i-1,i-2}$ for any integer i from i=I to i=n) is $\Delta_{zone2}$. A deviation of $\pm 0.05 \Delta_{zone2}$ from $\Delta_{zone1}$ is allowed in the first zone and the same deviation of $\pm 0.05 \Delta_{zone2}$ from $\Delta_{zone2}$ is allowed in the second zone. In the second zone the increment $\Delta_i$ is significantly larger than in the first zone (at least double). A relatively low increment $\Delta_{zone1}$ in the first zone near to the main pn-junction improves the safe operating area while only a relatively small area of the wafer is required by the FFR termination. With the two-zone linear design of the FFR termination according to the invention surprisingly the safe operating area can be improved without increasing the required wafer area compared to a FFR termination with an increment of the ring-to-ring separation, which is constant from the innermost ring to the outermost ring.

In the invention the following inequality applies for j=I−1:

$$2 \cdot \Delta_{zone2} < |\Delta_j|.$$

In this exemplary embodiment there is a significantly larger increment $\Delta_{I-1} = d_{I,I-1} - d_{I-1,I-2}$ from the ring-to-ring separation $d_{I-1,I-2}$ of the last pair of neighboring floating field rings in the first zone to the ring-to-ring separation $d_{I,I-1}$ of the first pair of neighboring floating field rings in the second zone. With such feature the electric field distribution in the FFR termination area can be smoothened and an electric field peak at the first main side surface of the wafer can be moved away from the active area, which can further improve the safe operating area of the power semiconductor device. Exemplarily, the increment $\Delta_{I-1}$ may be negative or may be positive.

In an exemplary embodiment the increment $\Delta_{zone1}$ in the first zone is zero. In such exemplary embodiment the safe operating area of the power device can be increased most efficiently compared to a FFR termination with an increment of the ring-to-ring separation, which is constant from the innermost ring to the outermost ring.

Exemplarily the increment $\Delta_{zone2}$ in the second zone is larger than 0.2 μm. Such relatively high increment in the second zone can increase the safe operating area of the device most efficiently without increasing the required wafer area compared to a FFR termination with an increment of the ring-to-ring separation, which is constant from the innermost ring to the outermost ring.

In an exemplary embodiment the integer I defining the end of the first zone and the beginning of the second zone is at least 4 but not higher than n/2. Exemplarily I is at least 5 but not higher than n/2.

In an exemplary embodiment, for any natural number i in a range from 1 to n, a lateral width $w_i$ of the i-th floating field ring in a lateral direction differs less than 20%, exemplarily less than 15% from a constant $w_r$. Throughout the specification of the present patent application the term lateral width of a floating field ring shall mean the minimum dimension of the floating field ring in a lateral direction which is perpendicular to the floating field ring. A lateral direction shall refer to a direction parallel to a main surface of the wafer. Exemplarily, one (or both) of the following inequalities may apply for the width $w_r$:

$$0.5 \text{ μm} \le w_r \le 20 \text{ μm},$$

$$1 \text{ μm} \le w_r \le 20 \text{ μm}.$$

In an exemplary embodiment the wafer has a first main side and a second main side opposite to the first main side. The wafer comprises a semiconductor layer of a first conductivity type adjacent to the first main side of the wafer, and the floating field rings are ring-shaped first well regions formed in the semiconductor layer, wherein the first well regions are of a second conductivity type to respectively form first pn-junctions with the semiconductor layer. The active area is an area of a second well region in the semiconductor layer, wherein the second well region is of the second conductivity type to form a second pn-junction with the semiconductor layer, which is the main pn-junction. Therein, a first depth of the first well regions may be the same for all floating field rings. Also, a second depth of the second well region may be the same as the first depth of the first well regions.

In an exemplary embodiment the following inequality applies for the distance of the innermost floating field ring from the main pn-junction:

$$1 \text{ μm} \le d_{1,0} \le 15 \text{ μm}.$$

Exemplarily the total number n of floating field rings is at least 20, more exemplarily at least 30.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have similar reference signs throughout the specification. The described comparative example and embodiments are meant as examples and shall not limit the scope of the invention.

DETAILED DESCRIPTION OF PREFERRED EMBODIMENTS

Figure 1:
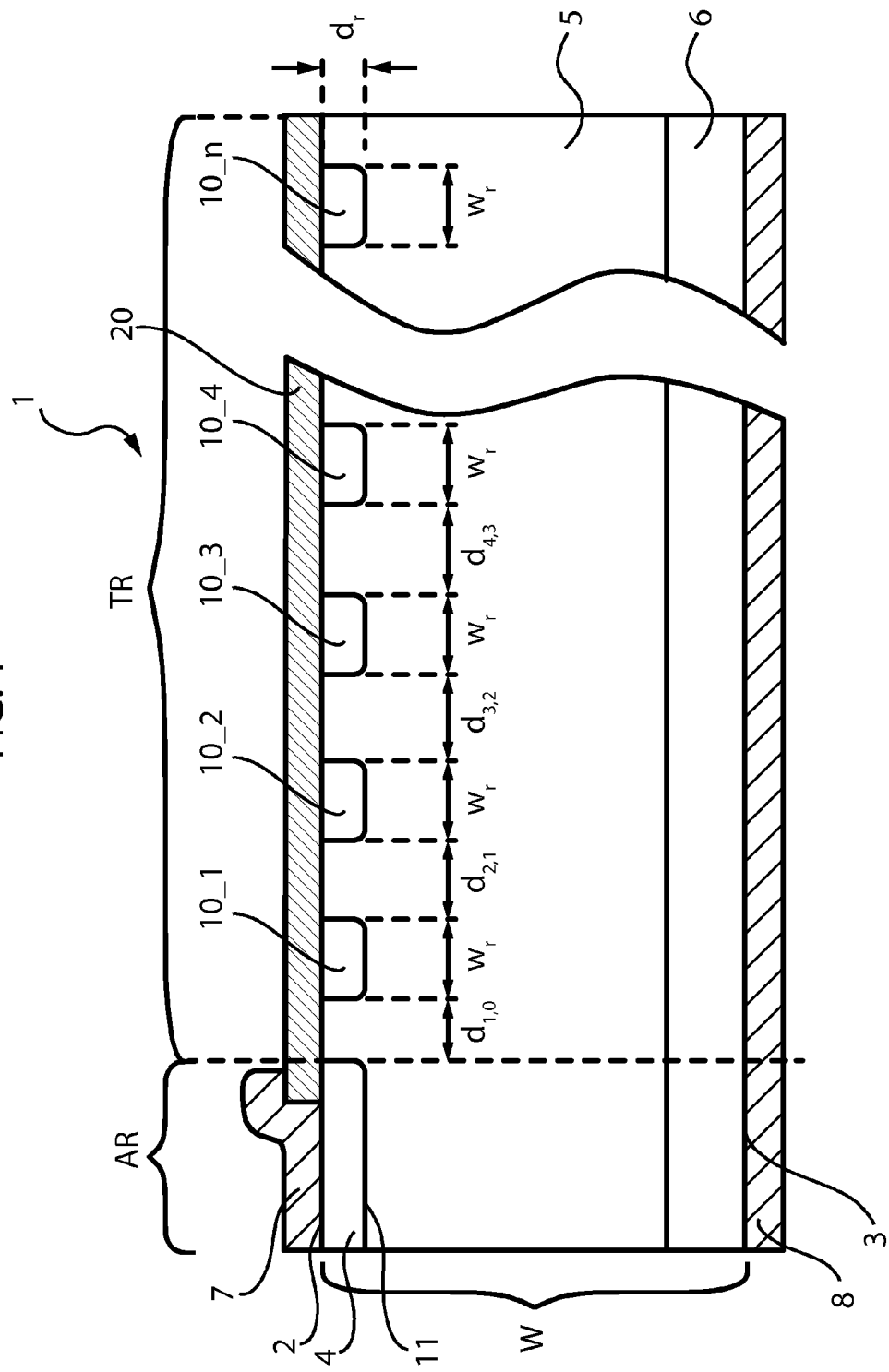
FIG. 1 shows a partial cross-sectional view illustrating the FFR termination of a power semiconductor device of the invention.

FIG. 1 is a partial cross-sectional view of a power semiconductor device 1 according to the invention. It comprises a semiconductor wafer W having a first main side surface 2 and a second main side surface 3, which is parallel to the first main side surface 2 and which is extending in a lateral direction. The wafer W has an active area AR and a termination area TR laterally surrounding the active area AR. In the order from the first main side surface 2 to the second main side surface 3, wafer W comprises a p-type anode layer 4, an n-type drift layer 5 and an n$^+$-type substrate layer 6 having a doping concentration higher than that of the n-type drift layer 5. Exemplarily the doping concentration of the substrate layer 6 is $5·10^{18}$ cm$^{-3}$ or more. The doping concentration of the anode layer 4 is exemplarily $5·10^{16}$ cm$^{-3}$ or more. The drift layer 5 is in direct contact with the anode layer 4 to form a main pn-junction 11. An anode electrode 7 is formed on the first main side surface 2 to form an ohmic contact with the anode layer 4. On the second main side surface 3 of the wafer W there is formed a cathode electrode 8 to form an ohmic contact with the substrate layer 6. The thickness of the drift layer 5 depends on the voltage class of the power semiconductor device.

A plurality of n p*-type floating field rings (FFRs) 10_1 to 10_n is formed in the termination area TR adjacent to the first main side surface 2 of the wafer W. Each one of the floating field rings 10_1 to 10_n is ring-shaped and laterally surrounds the active area AR and the anode layer 4. Also, each one of the floating field rings 10_1 to 10_n is in direct contact with the drift layer 5 to form a pn-junction with the drift layer 5, respectively. Exemplarily, the floating field rings 10_1 to 10_n have a peak doping concentration in a range between $1·10^{17}$ cm$^{-3}$ and $1·10^{19}$ cm$^{-3}$, respectively, exemplarily they have a peak doping concentration between $1·10^{18}$ cm$^{-3}$ and $1·10^{19}$ cm$^{-3}$, respectively. The floating field rings 10_1 to 10_n, which are embedded in the drift layer 5, may have in cross-section (perpendicular to its longitudinal axis) all the same doping profile and/or dimensions. In particular, all floating field rings may have the same depth $d_r$ and the same width $w_r$ in a direction perpendicular to its longitudinal axis, respectively, i.e. in a radial direction away from the active area AR towards a circumferential edge of the wafer W (which is a left-right direction in FIG. 1). The width $w_r$ is exemplarily 20 μm or less. It is exemplarily at least 0.5 μm or more exemplarily at least 1 μm. In another exemplary embodiment, the floating field rings 10_1 to 10_n may have in cross-section (perpendicular to its longitudinal axis) different doping profiles and/or different dimensions.

The total number n of floating field rings in the power semiconductor device 1 of the invention is at least 10. Depending on the voltage class of the power semiconductor device 1, the total number n of floating field rings is exemplarily at least 20, or is exemplarily at least 30. The lateral distance between the innermost floating field ring 10_1 and the main pn-junction 11 is denoted as $d_{1,0}$. Exemplarily, the distance $d_{1,0}$ is constant along the longitudinal axis of the innermost floating field ring 10_1, i.e. around the active area AR and the main pn-junction 11. The distance $d_{1,0}$ is defined as the minimum distance between the main pn-junction 11 and a second laterally adjacent pn-junction, which is formed by the innermost floating field ring 10_1 and the drift layer 5. In an FFR termination according to the invention the distance $d_{1,0}$ is exemplarily in a range from 1 μm to 15 μm.

The innermost floating field ring 10_1 in FIG. 1 is a first floating field ring, floating field ring 10_2 in FIG. 1 is a second floating field ring, floating field ring 10_3 in FIG. 1 is a third floating field ring and floating field ring 10_4 in FIG. 1 is a fourth floating field ring, when counting the floating field rings 10_1 to 10_n along a straight line starting from the main pn-junction 11 and extending in a lateral direction away from the main pn-junction 11. In general, the distance between the i-th floating field ring and a directly adjacent (i−1)-th floating field ring is denoted $d_{i,i-1}$. Therein, the term "directly adjacent" means that there is not located any other p doped floating field ring between the two directly adjacent floating field rings. The ring number i characterizes a position of the floating field ring in the FFR termination. Accordingly, the distance between the first and the second floating field rings 10_1 and 10_2 is denoted $d_{2,1}$, the distance between the second and the third floating field rings 10_2 and 10_3 is denoted $d_{3,2}$ and the distance between the third and the fourth floating field ring 10_3 and 10_4 is denoted $d_{4,3}$ in FIG. 1.

Figure 2:
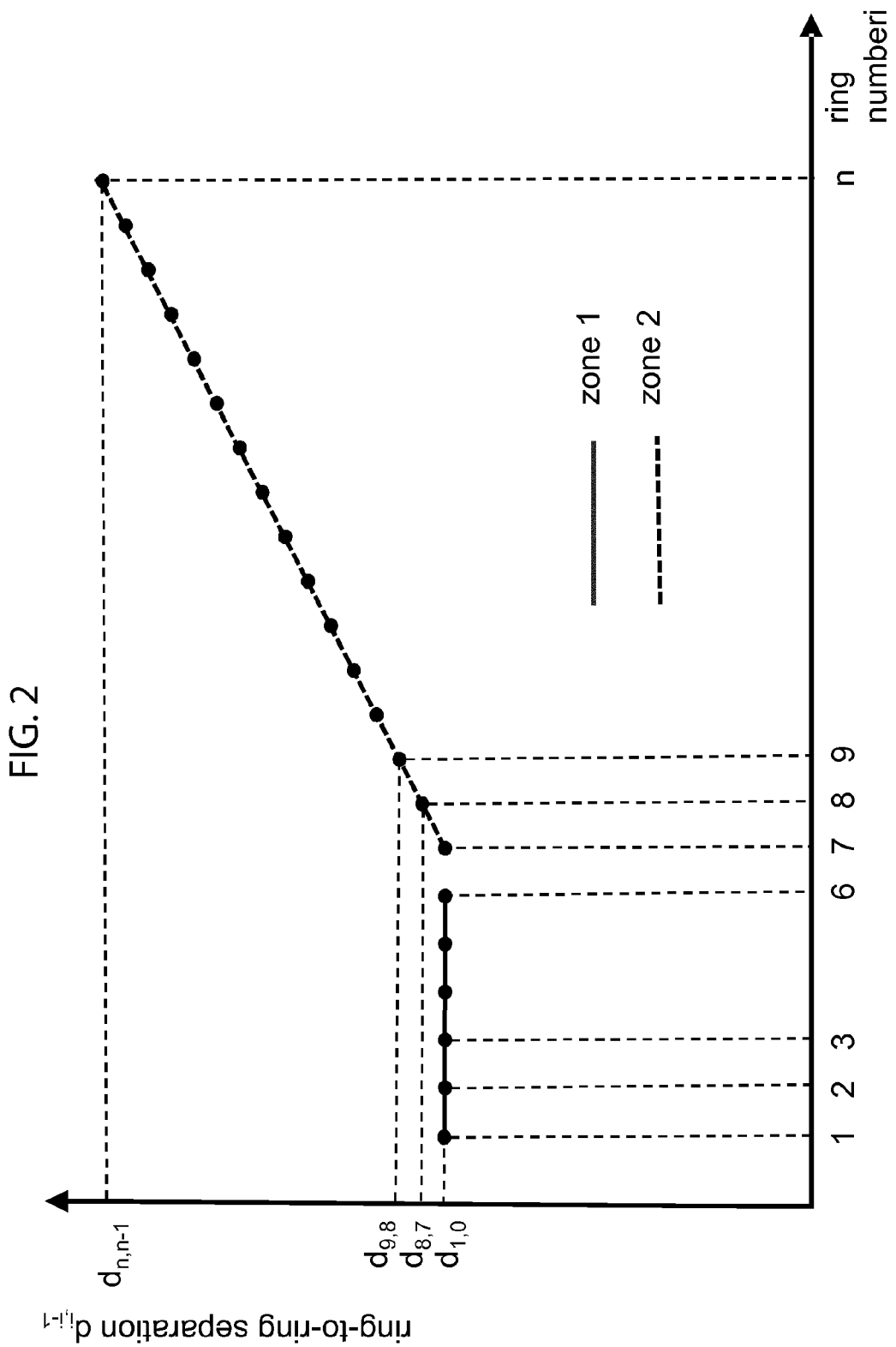
FIG. 2 is a diagram illustrating the ring-to-ring separation between two neighboring floating field rings as a function of the ring number of an outer one of each pair of neighboring floating field rings according to a comparative example (which is no part of the claimed invention but serves for a better understanding thereof)

In FIG. 2 there is shown a ring-to-ring separation $d_{i,i-1}$ between two neighboring floating field rings as a function of the ring number i of the outer floating field ring of each pair of neighboring floating field rings according to a comparative example, which does as such not form part of the claimed invention but serves for a better understanding thereof. In the comparative example the total number n of floating field rings is 22.

For ring number i from 2 to n=22, a ring-to-ring separation of the i-th floating field ring and its directly adjacent floating field ring, which is the (i−1)-th floating field ring counted from the active area AR in a direction away from the active area AR (i.e. when counting the floating field rings 10_1 to 10_n along a straight line starting from the main pn-junction 11 and extending in a lateral direction away from the main pn-junction 11), can be expressed by the following equation:

$$d_{i,i-1} = d_{1,0} + \Sigma_{j=1}^{j=i-1} \Delta_j \qquad \text{for } i=2 \text{ to } 22,$$

wherein $d_{1,0}$ is a distance between the innermost floating field ring closest to the main pn-junction, i.e. closest to the active area AR, and wherein $\Delta_j$ is the increment of the ring-to-ring separation from ring separation $d_{j+1,j}$ to $d_{j+1,j}$, i.e.:

$$\Delta_j = d_{j+1,j} - d_{j,j-1} \qquad \text{for } i=1 \text{ to } 21,$$

In a first zone the ring-to-ring separations $d_{2,1}$ to $d_{6,5}$ are all identical to the distance $d_{1,0}$ i.e. the increment $\Delta_j$ (wherein j is an integer in a range from 1 to 5) is zero except that a certain tolerance $0.05·\Delta_{zone2}$ is allowed for the increment $\Delta_j$. Specifically, the following inequality applies for the increments $\Delta_j$ where j is in a range from 1 to 5:

$$\Delta_{zone1} - 0.05·\Delta_{zone2} < \Delta_j < \Delta_{zone1} + 0.05·\Delta_{zone2} \text{ for } j=1 \text{ to } 5,$$

wherein $\Delta_{zone1} = 0$ μm and wherein $\Delta_{zone2}$ is higher than 0.1 μm, exemplarily $\Delta_{zone2}$ is higher than 0.2 μm.

In a second zone the ring-to-ring separations $d_{7,6}$ to $d_{22,21}$ increase linearly i.e. the increment $\Delta_j$ (wherein j is an integer in a range from 6 to 21) is basically constant in the second zone, except that a certain tolerance is allowed for the increment $\Delta_j$ in the second zone. Specifically, the following inequality applies for the increments $\Delta_j$ in the second zone (i.e. j is in a range from 7 to 21):

$$0.95·\Delta_{zone2} < \Delta_j < 1.05·\Delta_{zone2} \text{ for } j=7 \text{ to } 21.$$

In the comparative example, for the transition from the last ring-to-ring separation $d_{6,5}$ in the first zone to the first ring-to-ring separation $d_{7,6}$ in the second zone the following inequality applies for the increment $\Delta_j$:

$$\Delta_{zone1} - 0.05·\Delta_{zone2} < \Delta_j < \Delta_{zone1} + 0.05·\Delta_{zone2} \text{ for } j=6,$$

That means that in the comparative example, the inequality for the increment $\Delta_j$ in the first zone (j in a range from 1 to 5) applies also for the increment $\Delta_6$ defining the transition from the first to the second zone.

Figure 3:
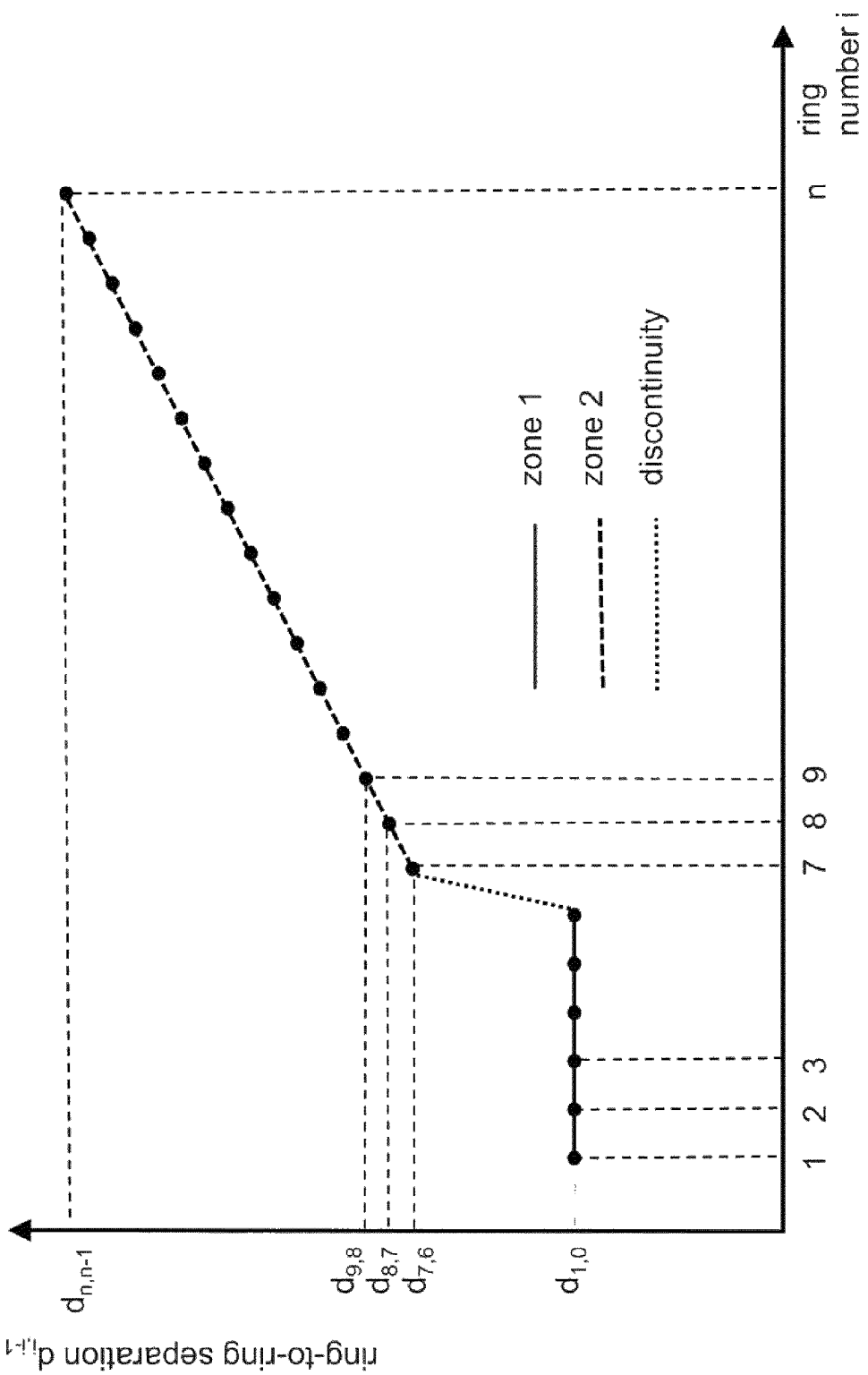
FIG. 3 is a diagram illustrating the ring-to-ring separation between two neighboring floating field rings as a function of the ring number of an outer one of each pair of neighboring floating field rings according to a first embodiment of the invention.

In FIG. 3 there is shown a ring-to-ring separation $d_{i,i-1}$ between two neighboring floating field rings as a function of the ring number i of the outer floating field ring of each pair of neighboring floating field rings according to a first embodiment of the invention. The first embodiment differs from the comparative example only in that the increment $\Delta_6$ defining the transition from the first zone (including distance $d_{1,0}$ and ring-to-ring separations $d_{2,1}$ to $d_{6,5}$) to the second zone (including ring-to-ring separations $d_{7,6}$ to $d_{22,21}$) is significantly larger than the increment $\Delta_{zone2}$ in the second zone:

$$2 \cdot \Delta_{zone2} < \Delta_j < 10 \cdot \Delta_{zone2}, \text{ for } j=6.$$

The remaining features of the first embodiment are the same as described above for the comparative example and it is referred to the description above.

Figure 4:
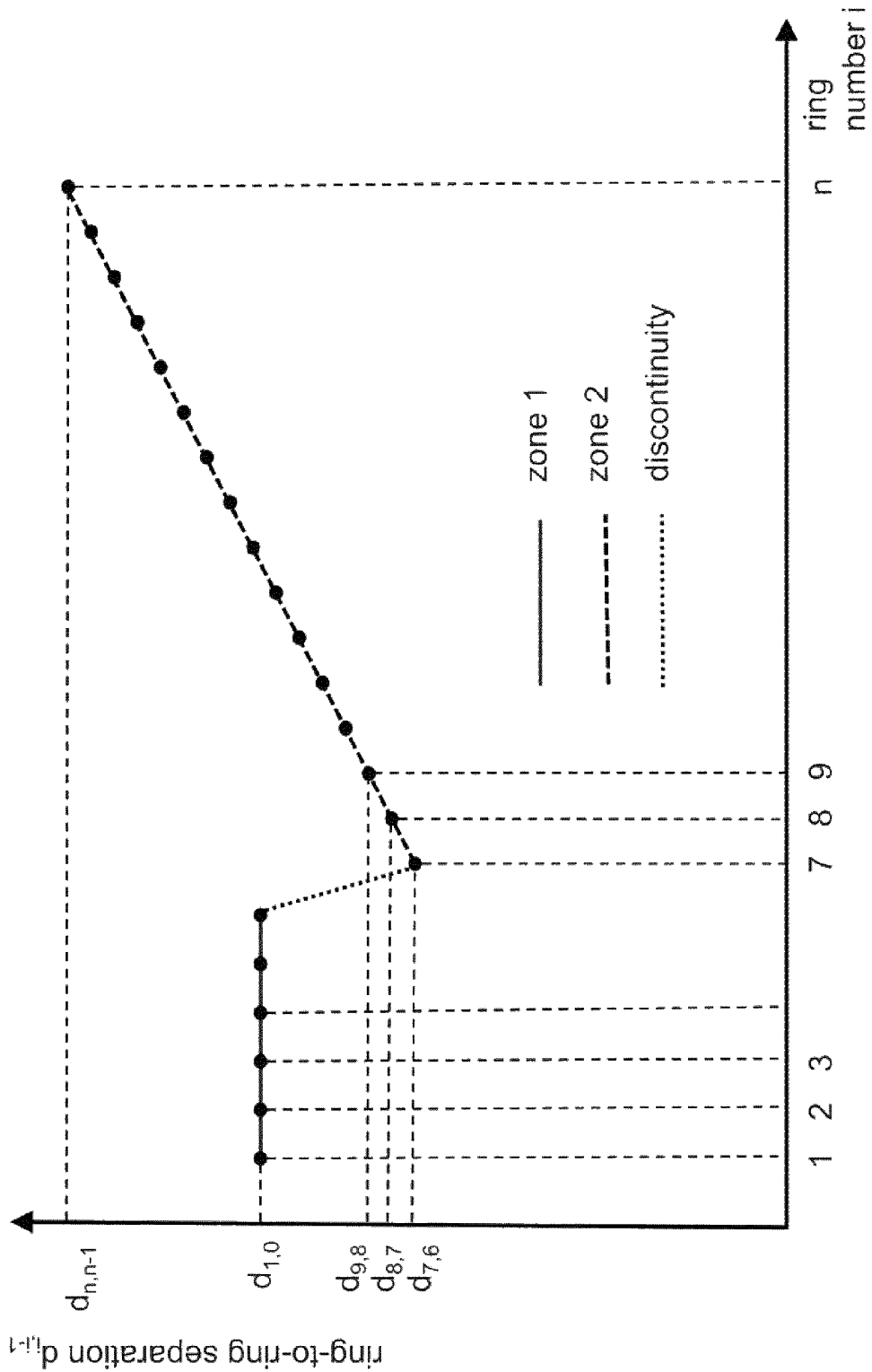
FIG. 4 is a diagram illustrating the ring-to-ring separation between two neighboring floating field rings as a function of the ring number of an outer one of each pair of neighboring floating field rings according to a second embodiment of the invention.

In FIG. 4 there is shown a ring-to-ring separation $d_{i,j-1}$ between two neighboring floating field rings as a function of the ring number i of the outer floating field ring of each pair of neighboring floating field rings according to a second embodiment of the invention. The second embodiment differs from the first embodiment only in that the increment $\Delta_6$ defining the transition from the first zone (including distance $d_{1,0}$ and ring-to-ring separations $d_{2,1}$ to $d_{6,5}$) to the second zone (including ring-to-ring separations $d_{7,6}$ to $d_{22,21}$) is negative:

$$-10 \cdot \Delta_{zone2} < \Delta_j < -2 \cdot \Delta_{zone2}, \text{ for } j=6.$$

The remaining features of the second embodiment are the same as described above for the comparative example and for the first embodiment and it is referred to the description above.

It will be apparent for persons skilled in the art that modifications of the above described embodiments are possible without departing from the scope of the invention as defined by the appended claims.

In the above described embodiments, the power semiconductor device was described to be a pin diode. However, the power semiconductor device of the invention may be any other power semiconductor device such as a power MOSFET or MISFET, an insulated-gate bipolar transistor (IGBT), a reverse conducting IGBT (RC-IGBT), a thyristor device or a Schottky diode using an FFR termination. The main pn-junction may be any pn-junction in the active area AR, which is closest to the innermost floating field ring in a laterally direction.

It is to be noted that throughout the present description the term "wafer" means any thin slice of semiconductor material and shall include the meaning of a chip or die. A wafer within the meaning of the present patent application may have any shape such as a circular shape or a rectangular shape. Also, in the above described embodiments the wafer W may be any semiconductor wafer including a silicon (Si) wafer or any group-III-V-compound semiconductor wafer, such as a silicon carbide (SiC) wafer or an aluminum gallium nitride (AlGaN) wafer. The material of the wafer W may also include any combination of different semiconductor materials.

In the above described first and second embodiments the total number n of floating field rings was n=22. However, the total number of floating field rings may be any number n equal to or higher than 10. Also, in the above discussed first and second embodiments the first zone included distance $d_{1,0}$ and ring-to-ring separations $d_{2,1}$ to $d_{6,5}$ and the second zone included ring-to-ring separations $d_{7,6}$ to $d_{22,21}$. However, in modified first and second embodiments, the first zone may include distance $d_{1,0}$ and ring-to-ring separations $d_{2,1}$ to $d_{I-1,I-2}$, and the second zone may include ring-to-ring separations to $d_{I,I-1}$ to $d_{n,n-1}$, wherein I may be any integer which is at least 3 and equal to or smaller than n/2. Exemplarily, I may be an integer which is at least 4 and equal to or smaller than n/2. In an embodiment, in which the first zone includes distance $d_{1,0}$ and ring-to-ring separations $d_{2,1}$ to $d_{I-1,I-2}$, and the second zone includes ring-to-ring separations to $d_{I,I-1}$ to $d_{n,n-1}$, increment $\Delta_{I-1}$ defines the transition from the first to the second zone.

In the above described embodiments $\Delta_{zone1}$ was described to be 0 µm. However, the object of the invention is also attained if $\Delta_{zone1}$ is different from 0 µm as long as its absolute value is significantly smaller than $\Delta_{zone2}$. Specifically, the object of the invention is still attained as long as the following inequality is fulfilled:

$$-\Delta_{zone2}/2 < \Delta_{zone1} < \Delta_{zone2}/2.$$

It was described above that in a power semiconductor device of the invention the lateral width $w_r$ is the same for all floating field rings. However, a relatively small deviation, for example due to manufacturing tolerances, may be possible. In an exemplary embodiment, for any integer i in a range from 1 to n (wherein n is the total number of floating field rings in the FFR termination), a lateral width $w_i$ of the i-th floating field ring may differ less than 20%, exemplarily less than 15% from a constant $w_r$.

It should be noted that the term "comprising" does not exclude other elements or steps and that the indefinite article "a" or "an" does not exclude the plural. Also elements described in association with different embodiments may be combined.

LIST OF REFERENCE SIGNS 1 power semiconductor device
2 first main side surface
3 second main side surface
4 (p-type) anode layer,
5 (n-type) drift layer
6 ($n^+$-type) substrate layer
7 anode electrode
8 cathode electrode
11 main pn-junction.
AR active area
TR termination area
W wafer

The invention claimed is:

1. A power semiconductor device comprising:
a wafer, the wafer having an active area and a termination area laterally surrounding the active area, wherein a main pn-junction is formed in the active area, and
a plurality of floating field rings formed in the termination area, each floating field ring laterally surrounding the active area, wherein a total number of floating field rings formed in the termination area is n,
wherein, for any integer i in a range from i=2 to i=n, a distance between an i-th floating field ring (10_i), and a directly adjacent (i−1)-th floating field ring (10_i−1), when counting the floating field rings (10_1 to 10_n) along a straight line starting from the main pn-junction and extending in a lateral direction away from the main pn-junction, is given by the following formula:

$$d_{i,i-1} = d_{1,0} + \Sigma_{j=1}^{j=i-1} \Delta_j \text{ for } i=2 \text{ to } n,$$

wherein $d_{1,0}$ is a distance between the innermost floating field ring (10_1) directly adjacent to the main pn-junction and the main pn-junction, and wherein:

$$\Delta_{zone1} - 0.05 \cdot \Delta_{zone2} < \Delta_j < \Delta_{zone1} + 0.05 \cdot \Delta_{zone2} \text{ for } j=1 \text{ to } I-2,$$

$$|\Delta_j| < 10 \cdot \Delta_{zone2} \text{ for } j=I-1,$$

$0.95 \cdot \Delta_{zone2} < \Delta_j < 1.05 \cdot \Delta_{zone2}$ for $j=l$ to $n-1$, $\Delta_{zone2} > 0.1$ μm, $-\Delta_{zone2}/2 < \Delta_{zone1} < \Delta_{zone2}/2$, and wherein j and l are integers, and $3 \leq l \leq n/2$, wherein n is at least 10 and $2 \cdot \Delta_{zone2} < |\Delta_j|$ for $j=l-1$.

2. The power semiconductor device according to claim 1, wherein $-10 \cdot \Delta_{zone2} < \Delta_j < -2 \cdot \Delta_{zone2}$ for $j=l-1$.

3. The power semiconductor device according to claim 1, wherein $2 \cdot \Delta_{zone2} < \Delta_j < 10 \cdot \Delta_{zone2}$ for $j=l-1$.

4. The power semiconductor device according to claim 1, wherein $\Delta_{zone1} = 0$ μm.

5. The power semiconductor device according to claim 1, wherein $\Delta_{zone2} > 0.2$ μm.

6. The power semiconductor device according to claim 1, wherein $4 \leq l \leq n/2$, or $5 \leq l \leq n/2$.

7. The power semiconductor device according to claim 1, wherein for any natural number i in a range from 1 to n, a lateral width $w_i$ of the i-th floating field ring (10_i) from the main pn-junction differs less than 20% from a constant $w_r$.

8. The power semiconductor device according to claim 7, wherein $0.5$ μm $\leq w_r \leq 20$ μm, or $1$ μm $\leq w_r \leq 20$ μm.

9. The power semiconductor device according to claim 1, wherein:
the wafer has a first main side and a second main side opposite to the first main side,
the wafer comprises a semiconductor layer of a first conductivity type adjacent to the first main side of the wafer,
the floating field rings (10_1 to 10_n) are ring-shaped first well regions formed in the semiconductor layer, wherein the first well regions are of a second conductivity type to respectively form first pn-junctions with the semiconductor layer,
the active area is an area of a second well region in the semiconductor layer, wherein the second well region is of the second conductivity type to form the main pn-junction with the semiconductor layer.

10. The power semiconductor device according to claim 9, wherein a first depth ($d_r$) of the first well regions is the same for all floating field rings (10_1 to 10_n).

11. The power semiconductor device according to claim 10, wherein a second depth of the second well region is the same as the first depth ($d_r$) of the first well regions.

12. The power semiconductor device according to claim 1, wherein $1$ μm $\leq d_{1,0} \leq 15$ μm.

13. The power semiconductor device according to claim 1, wherein the total number n of floating field rings (10_1 to 10_n) is at least 20.

14. The power semiconductor device according to claim 13, wherein the total number n of floating field rings (10_1 to 10_n) is at least 30.

15. The power semiconductor device according to claim 7, wherein for any natural number i in a range from 1 to n, a lateral width $w_i$ of the i-th floating field ring (10_i) from the main pn-junction differs less than 15%-from a constant $w_r$.

16. The power semiconductor device according to claim 2, wherein $\Delta_{zone1} = 0$ μm.

17. The power semiconductor device according to claim 2, wherein $\Delta_{zone2} > 0.2$ μm.

18. The power semiconductor device according to claim 2, wherein $4 \leq l \leq n/2$, or $5 \leq l \leq n/2$.

19. The power semiconductor device according to claim 15, wherein $0.5$ μm $\leq w_r \leq 20$ μm, or $1$ μm $\leq w_r \leq 20$ μm.

20. The power semiconductor device according to claim 2, wherein:
the wafer has a first main side and a second main side opposite to the first main side,
the wafer comprises a semiconductor layer of a first conductivity type adjacent to the first main side of the wafer,
the floating field rings (10_1 to 10_n) are ring-shaped first well regions formed in the semiconductor layer, wherein the first well regions are of a second conductivity type to respectively form first pn-junctions with the semiconductor layer,
the active area is an area of a second well region in the semiconductor layer, wherein the second well region is of the second conductivity type to form the main pn-junction with the semiconductor layer.

* * * * *